United States Patent
Lee et al.

(10) Patent No.: US 12,216,916 B2
(45) Date of Patent: Feb. 4, 2025

(54) STORAGE DEVICE AND OPERATING METHOD THEREOF

(71) Applicant: Samsung Electronics Co., Ltd., Suwon-si (KR)

(72) Inventors: Youngsik Lee, Suwon-si (KR); Seunghyun Shin, Hwaseong-si (KR); Sunmi Yoo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 73 days.

(21) Appl. No.: 17/978,415

(22) Filed: Nov. 1, 2022

(65) Prior Publication Data
US 2023/0142479 A1     May 11, 2023

(30) Foreign Application Priority Data

Nov. 10, 2021 (KR) ........................ 10-2021-0154270
Jan. 27, 2022 (KR) ........................ 10-2022-0012595

(51) Int. Cl.
    *G06F 3/06*           (2006.01)

(52) U.S. Cl.
    CPC .......... *G06F 3/0619* (2013.01); *G06F 3/0653* (2013.01); *G06F 3/0659* (2013.01); *G06F 3/0679* (2013.01)

(58) Field of Classification Search
None
See application file for complete search history.

(56) References Cited

U.S. PATENT DOCUMENTS

| | | |
|---|---|---|
| 7,260,695 B2 | 8/2007 | Batchelor et al. |
| 9,037,786 B2 | 5/2015 | Asnaashari et al. |
| 9,042,197 B2 | 5/2015 | Allison et al. |

(Continued)

FOREIGN PATENT DOCUMENTS

| | | |
|---|---|---|
| JP | 2006-323617 A | 11/2006 |
| KR | 10-2001-0063096 A | 7/2001 |
| KR | 10-2016-0092206 A | 8/2016 |
| KR | 10-2016-0144564 A | 12/2016 |

(Continued)

OTHER PUBLICATIONS

Office Action for Korean Application No. 10-2022-0012595 dated Dec. 5, 2022.

(Continued)

*Primary Examiner* — Yaima Rigol
*Assistant Examiner* — Alexander J Yoon
(74) *Attorney, Agent, or Firm* — Harness, Dickey & Pierce, P.L.C.

(57) ABSTRACT

Provided are a storage device and an operating method thereof. The storage device includes a non-volatile memory including a plurality of memory regions and a storage controller configured to control the non-volatile memory through a performance path and at least one direct path, the storage controller including a buffer memory configured to store recovery data, wherein the storage controller writes the recovery data to the non-volatile memory through the at least one direct path in response to power being cut off and a fault being detected in the performance path, the performance path is a path for performing a write operation, a read operation, and an erase operation, and the at least one direct path is a path for performing only a write operation.

20 Claims, 12 Drawing Sheets

(56) References Cited

U.S. PATENT DOCUMENTS

| | | | |
|---|---|---|---|
| 9,298,240 | B2 | 3/2016 | Zettsu |
| 9,355,723 | B1 | 5/2016 | Lym |
| 10,090,858 | B2 | 10/2018 | Cho et al. |
| 10,613,782 | B2 | 4/2020 | Kim et al. |
| 10,657,043 | B2 | 5/2020 | Park et al. |
| 10,719,382 | B2 | 7/2020 | Gim |
| 10,846,013 | B1 | 11/2020 | Park |
| 2015/0186278 | A1* | 7/2015 | Jayakumar ............ G06F 1/3275 711/103 |
| 2017/0228154 | A1 | 8/2017 | Liu et al. |
| 2018/0089116 | A1* | 3/2018 | Park ........................ G06F 13/28 |
| 2019/0205244 | A1* | 7/2019 | Smith ...................... G06F 3/065 |
| 2020/0050512 | A1* | 2/2020 | Basu ...................... G06F 3/0631 |
| 2022/0206702 | A1* | 6/2022 | Gao ........................ G06F 3/0647 |
| 2022/0365842 | A1 | 11/2022 | Jeong et al. |

FOREIGN PATENT DOCUMENTS

| | | | |
|---|---|---|---|
| KR | 10-2017-0070921 | A | 6/2017 |
| KR | 10-1912023 | B1 | 10/2018 |
| KR | 10-2020-0001158 | A | 1/2020 |
| KR | 10-2021-0004726 | A | 1/2021 |
| KR | 10-2021-0034456 | A | 3/2021 |
| KR | 10-2277728 | B1 | 7/2021 |
| KR | 10-2317788 | B1 | 10/2021 |

OTHER PUBLICATIONS

Notice of Allowance for Korean Application No. 10-2022-0012595 dated Apr. 5, 2023.

Extended European Search Report issued Jun. 14, 2023 in European Application No. 22198600.3.

* cited by examiner

STORAGE DEVICE AND OPERATING METHOD THEREOF

CROSS-REFERENCE TO RELATED APPLICATIONS

This application is based on and claims priority under 35 U.S.C. § 119 to Korean Patent Application No. 10-2021-0154270, filed on Nov. 10, 2021 and Korean Patent Application No. 10-2022-0012595, filed on Jan. 27, 2022, in the Korean Intellectual Property Office, the disclosures of which are incorporated by reference herein in their entireties.

BACKGROUND

The example embodiments relate to a storage device and/or an operating method thereof, and more particularly, to a storage device performing a power off recovery operation and/or an operating method thereof.

Flash memories, as non-volatile memories, retain stored data even when power is cut off. Recently, storage devices including flash memories, such as an embedded multi-media card (eMMC), a universal flash storage (UFS), a solid state drive (SSD), and memory cards, have been widely used, and may be used to store or move a large amount of data.

When power is suddenly turned off due to an external factor, for example, when a power failure occurs, data in a buffer memory inside a storage device may be lost. To prevent (or alternatively, to reduce the likelihood of) this, power loss protection (PLP) may be used.

SUMMARY

Example embodiments of the inventive concepts provide a storage device capable of preventing (or alternatively reducing the likelihood of) an error state from occurring even when an error occurs due to a power failure, and/or an operating method thereof.

According to some example embodiments of the inventive concepts, there is provided a storage device including a non-volatile memory including a plurality of memory regions and a storage controller configured to control the non-volatile memory through a performance path and at least one direct path, the storage controller including a buffer memory configured to store recovery data, wherein the storage controller writes the recovery data to the non-volatile memory through the at least one direct path in response to power being cut off and a fault being detected in the performance path, the performance path is a path for performing a write operation, a read operation, and an erase operation, and the at least one direct path is a path for performing only a write operation.

According to some example embodiments of the inventive concepts, there is provided an operating method of a storage device including a storage controller and a non-volatile memory, including selecting a core and collecting recovery data written in a buffer memory, in response to power being cut off and a fault being detected in a performance path and writing the recovery data to the non-volatile memory through a direct path corresponding to the selected core, wherein the performance path is a path for performing a write operation, a read operation, and an erase operation, and the direct path is a path for performing only a write operation.

According to some example embodiments of the inventive concepts, there is provided an operating method of a storage device including a storage controller and a non-volatile memory, including setting write information for writing recovery data written in a buffer memory to the non-volatile memory, selecting a core and collecting the recovery data, in response to power being cut off and a fault of a performance path being detected, and writing the recovery data to the non-volatile memory through a direct path corresponding to the selected core, wherein the performance path includes a plurality of cores, and the direct path includes one core.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EXAMPLE EMBODIMENTS

Hereinafter, various example embodiments of the inventive concepts are described with reference to the accompanying drawings.

Figure 1:
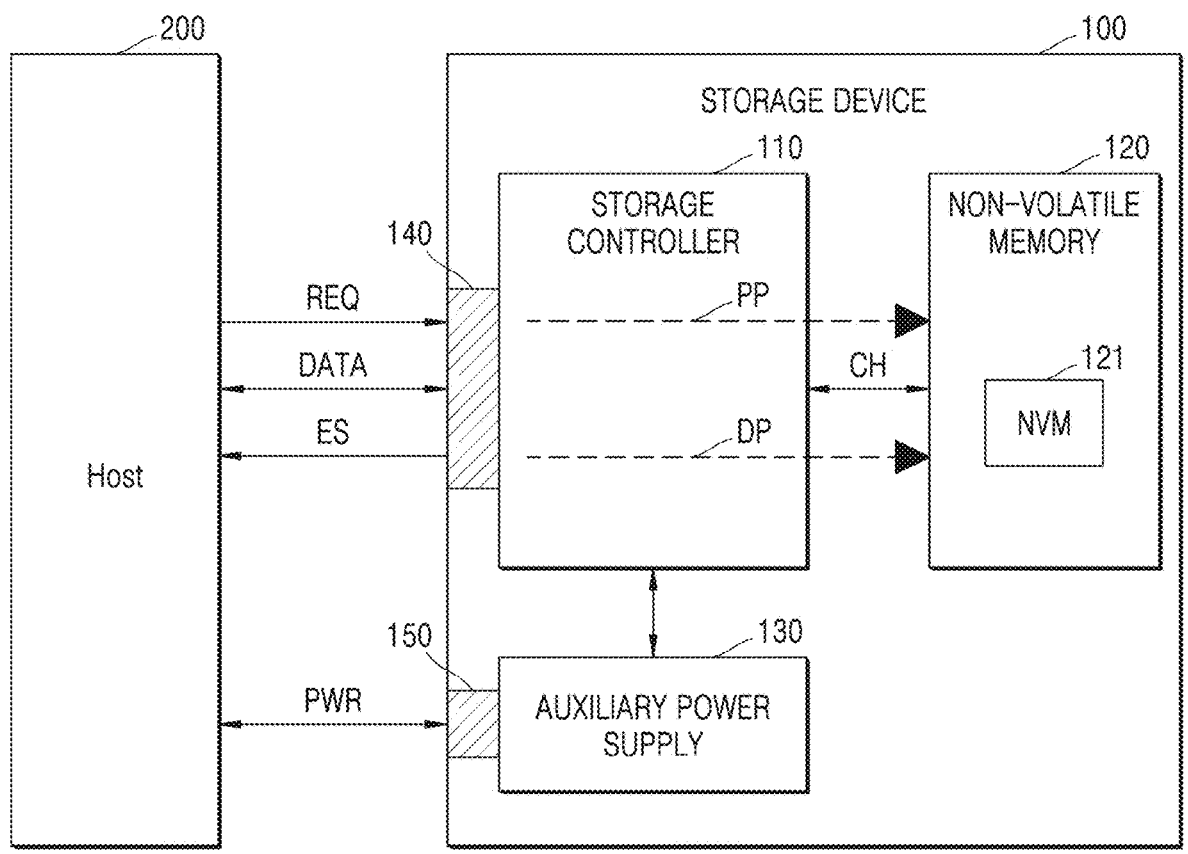
FIG. 1 is a block diagram illustrating a storage system according to some example embodiments of the inventive concepts.

FIG. 1 is a block diagram illustrating a storage system 10 according to some example embodiments of the inventive concepts.

The storage system 10 may be implemented as, for example, a personal computer (PC), a data server, a network-attached storage (NAS), an Internet of Things (IoT) device, or a portable electronic device. Portable electronic devices may include laptop computers, mobile phones, smartphones, tablet PCs, personal digital assistants (PDAs), enterprise digital assistants (EDAs), digital still cameras, digital video cameras, audio devices, portable multimedia players (PMPs), personal navigation devices (PNDs), MP3 players, handheld game consoles, e-books, wearable devices, and the like.

The storage system 10 may include a storage device 100 and a host 200. The host 200 may control an operation of the storage device 100. In an example embodiment, the storage device 100 may include one or more solid state drives (SSDs). When the storage device 100 includes an SSD, the storage device 100 may include a plurality of flash memory devices (e.g., NAND memory devices) that store data.

The storage device 100 may correspond to a flash memory device including one or more flash memory devices. In an example embodiment, the storage device 100 may be an embedded memory embedded in the storage system 10. For example, the storage device 100 may be an embedded multi-media card (eMMC) or an embedded universal flash storage (UFS) memory device. In an example embodiment, the storage device 100 may be an external memory detachable from the storage system 10. For example, the storage device 100 may include a UFS memory card, a compact flash (CF) card, a secure digital (SD) card, a micro-SD card, a mini-SD card, an extreme digital (XD) card, or a memory stick.

Referring to FIG. 1, the storage system 10 may include the storage device 100 and the host 200. The host 200 and the storage device 100 may communicate with each other through various interfaces. The storage device 100 may transmit and receive signals to and from the host 200 through a signal connector 140, and may receive power through a power connector 150.

The host 200 may transmit a request REQ, such as a read request and a program request, to the storage device 100. In an example embodiment, the host 200 may be implemented as an application processor (AP) or a system-on-a-chip (SoC).

The storage device 100 may include a storage controller 110, a non-volatile memory 120, and an auxiliary power supply 130.

The storage controller 110 may transmit and receive signals to and from the host 200 through the signal connector 140. Here, the signals may include a request REQ, data DATA, and an error signal ES.

The storage controller 110 may control an operation of the non-volatile memory 120 through a channel CH. The storage controller 110 may control the non-volatile memory 120 to read data DATA stored in the non-volatile memory 120, in response to a read request from the host 200, or write data DATA to the non-volatile memory 120, in response to a write request from the host 200.

In an example embodiment, the non-volatile memory 120 may include a plurality of memory devices (NVM) 121 that store data. Each of the memory devices 121 may be a semiconductor chip or a semiconductor die. Each of the memory devices 121 may be connected to a channel corresponding thereto. For example, the memory devices 121 may include first memory devices connected to the storage controller 110 through a first channel, second memory devices connected to the storage controller 110 through a second channel, and m-th memory devices connected to the storage controller 110 through an m-th channel In this case, m may be a natural number of 2 or greater. A write operation, a read operation, and an erase operation may be performed on a plurality of memory devices connected to the same channels, among the memory devices 121, in an interleaving manner.

The memory devices 121 may include memory cell arrays, respectively, and in an example embodiment, the memory cell array may include flash memory cells, and, for example, the flash memory cells may be NAND flash memory cells. However, the inventive concepts are not limited thereto, and the memory cells may include resistive memory cells, such as resistive RAM (ReRAM) memory cells, phase change RAM (PRAM) memory cells, and magnetic RAM (MRAM) memory cells.

The auxiliary power supply 130 may be connected to the host 200 through the power connector 150. The auxiliary power supply 130 may receive power PWR from the host 200 and perform charging. However, the auxiliary power supply 130 may be located in the storage device 100 or outside the storage device 100. The auxiliary power supply 130 may generate an internal power voltage based on power PWR and may provide the internal power voltage to the storage controller 110 and the non-volatile memory 120.

In an example embodiment, the auxiliary power supply 130 may include a power-loss protection integrated circuit (PLP IC). The PLP IC may generate an auxiliary power voltage for a certain period of time and provide the generated auxiliary power voltage to the storage controller 110 and the non-volatile memory 120, when power of the storage device 100 is suddenly cut off (i.e., sudden power off or power failure).

During a normal operation, that is, while power is supplied, the storage controller 110 may write data to the non-volatile memory 120 through a performance path PP. Meanwhile, when power is suddenly cut off and a fault is detected in the performance path PP, data may be written to the non-volatile memory 120 through a direct path DP. In this case, the performance path PP may be a path for a core included in the storage controller 110 to perform an operation, e.g., a write operation (or a program operation), a read operation, and an erase operation on the non-volatile memory 120 through several modules. Meanwhile, the direct path DP may be a path for the core included in the storage controller 110 to directly write data to the non-volatile memory 120 without passing through another module, core, controller, or other processing circuitry. That is, the direct path DP may be a separate path defined for performing an operation of moving and writing data written in the buffer memory of the storage controller 110 to the non-volatile memory 120 when power is cut off.

In an example embodiment, the storage controller 110 may determine whether a fault of the performance path PP has occurred from an assert or a core hang. Alternatively, in an example embodiment, the storage controller 110 may determine that a fault has occurred in the performance path PP when it is determined that each step of a power cutoff processing operation through the performance path PP is not processed within a specified time, or alternatively, a desired time.

When a fault is detected in the performance path PP, the storage device 100 may store recovery data stored in the buffer memory in the non-volatile memory 120 through the direct path DP in which a certain core directly accesses the non-volatile memory 120. Accordingly, even if an error occurs during power failure processing, the storage device may be prevented from (or alternatively, reduce the likelihood of) falling into an error state and the storage device may be continuously used. A configuration of the recovery data is described in detail below with reference to FIG. 7.

The storage device 100 may transmit the error signal ES to the host 200 when user data cannot be written to the non-volatile memory 120 due to a sudden power cutoff. For example, the error signal ES may be transmitted to the host 200 as rebuild assist.

Figure 2:
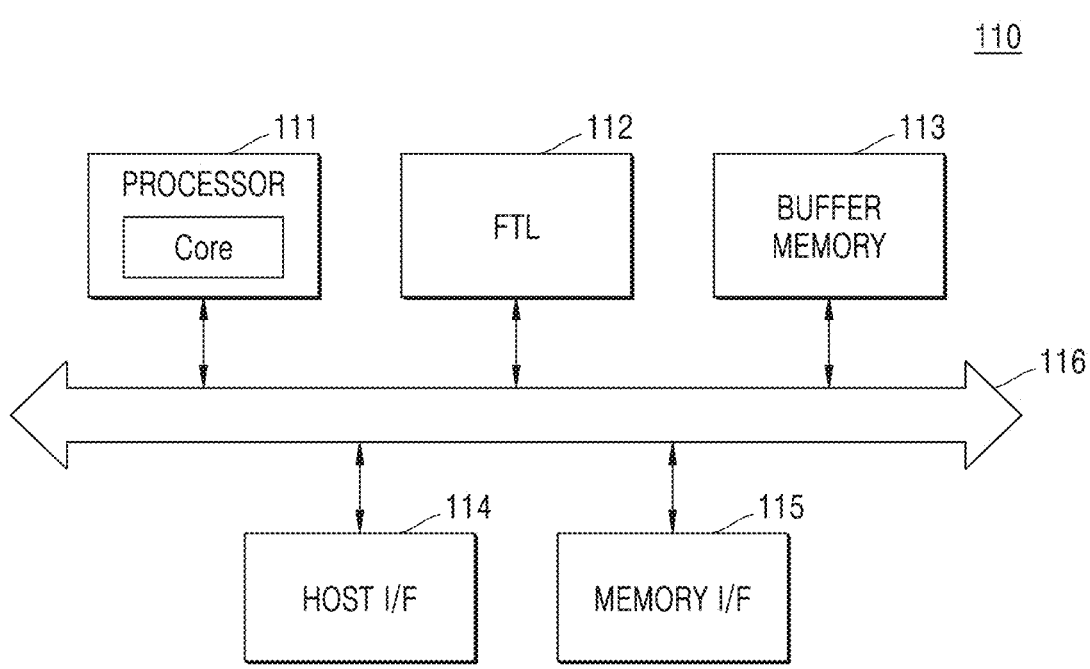
FIG. 2 is a block diagram illustrating a storage controller of a storage device according to some example embodiments of the inventive concepts.

FIG. 2 is a block diagram illustrating the storage controller 110 of the storage device 100 according to some example embodiments of the inventive concepts.

Referring to FIGS. 1 and 2, the storage controller 110 may include a processor 111, a host interface (I/F) 114, and a memory interface (I/F) 115. In addition, the storage controller 110 may include a flash translation layer (FTL) 112 and a buffer memory 113. The storage controller 110 may further include a working memory into which the FTL 112 is loaded, and the processor 111 may execute the FTL 112 to control a data write and read operation on the non-volatile memory 120. The components of the storage controller 110 may communicate with each other through a bus 116.

The processor 111 may include a central processing unit or a microprocessor, and may control the overall operation of the storage controller 110. The processor 111 may include one or more cores capable of executing an instruction set of program code configured to perform a certain operation. For example, the processor 111 may execute command code of firmware stored in the working memory.

The processor 111 may control each component of the storage controller 110 included in the performance path PP to write data to the non-volatile memory 120 or read or erase data from the non-volatile memory 120. When a power cutoff is detected, the processor 111 may first control each component of the storage controller 110 included in the performance path PP, thereby performing a power cutoff processing operation on the non-volatile memory 120 for the data written in the buffer memory 113.

In an example embodiment, the processor 111 may include one core. When the power is cut off and a fault is detected in the performance path PP, the core of the processor 111 may execute a dedicated context to perform an operation of storing the recovery data, stored in the buffer memory 113, in the non-volatile memory 120. For example, the core of the processor 111 may perform the above operation by executing an interrupt context or processing a real time operating system (RTOS) task, and a path for the core of the processor 111 to perform the above operation may be defined as the direct path DP. Alternatively, in an example embodiment, the processor 111 may include a plurality of cores, and an operation of the processor 111 including the cores is described in detail below in FIGS. 3, 4, and 5.

The host I/F 114 may transmit and receive packets to and from the host 200. A packet transmitted from the host 200 to the host I/F 114 may include a request (REQ in FIG. 1) or data (DATA in FIG. 1) to be written to the non-volatile memory 120, and the like, and a packet transmitted from the host I/F 114 to the host 200 may include a response to the request REQ or data DATA read from the non-volatile memory 120. For example, the host I/F 114 may provide an interface according to a universal serial bus (USB) interface, a multimedia card (MMC) interface, a peripheral component interconnection express (PCI-E) interface, an advanced technology attachment (ATA) interface, a serial AT attachment (SATA), a parallel AT attachment (PATA) interface, a small computer system interface (SCSI), a serial attached SCSI (SAS) interface, an enhanced small disk interface (ESDI), an integrated drive electronics (IDE) interface, etc.

The memory interface 115 may transmit data to be written to the non-volatile memory 120 to the non-volatile memory 120 or receive data read from the non-volatile memory 120. The memory interface 115 may be implemented to comply with a standard protocol, such as toggle or the Open HAND Flash Interface (ONFI).

The FTL 112 may perform various functions, such as address mapping, wear-leveling, and garbage collection. An address mapping operation is an operation of changing a logical address received from the host into a physical address used to actually store data in the non-volatile memory 120. Wear-leveling is technology allowing blocks in the non-volatile memory 120 to be used uniformly, thereby preventing (or alternatively, reducing the likelihood of) excessive degradation of a specific block, which may be implemented through, for example, firmware technology of balancing erase counts of physical blocks Garbage collection is technology of securing the usable capacity in the non-volatile memory 120 by copying valid data of a block to a new block and then erasing an existing block.

The buffer memory 113 may temporarily store data to be written to the non-volatile memory 120 or data to be read from the non-volatile memory 120. The buffer memory 113 may be provided in the storage controller 110 or may also be disposed outside the storage controller 110.

In an example embodiment, the buffer memory 113 may be dynamic random access memory (DRAM). However, the inventive concepts are not limited thereto, and the buffer memory 113 may be implemented as static random access memory (SRAM), phase—change random access memory (PRAM), or flash memory.

Figure 3:
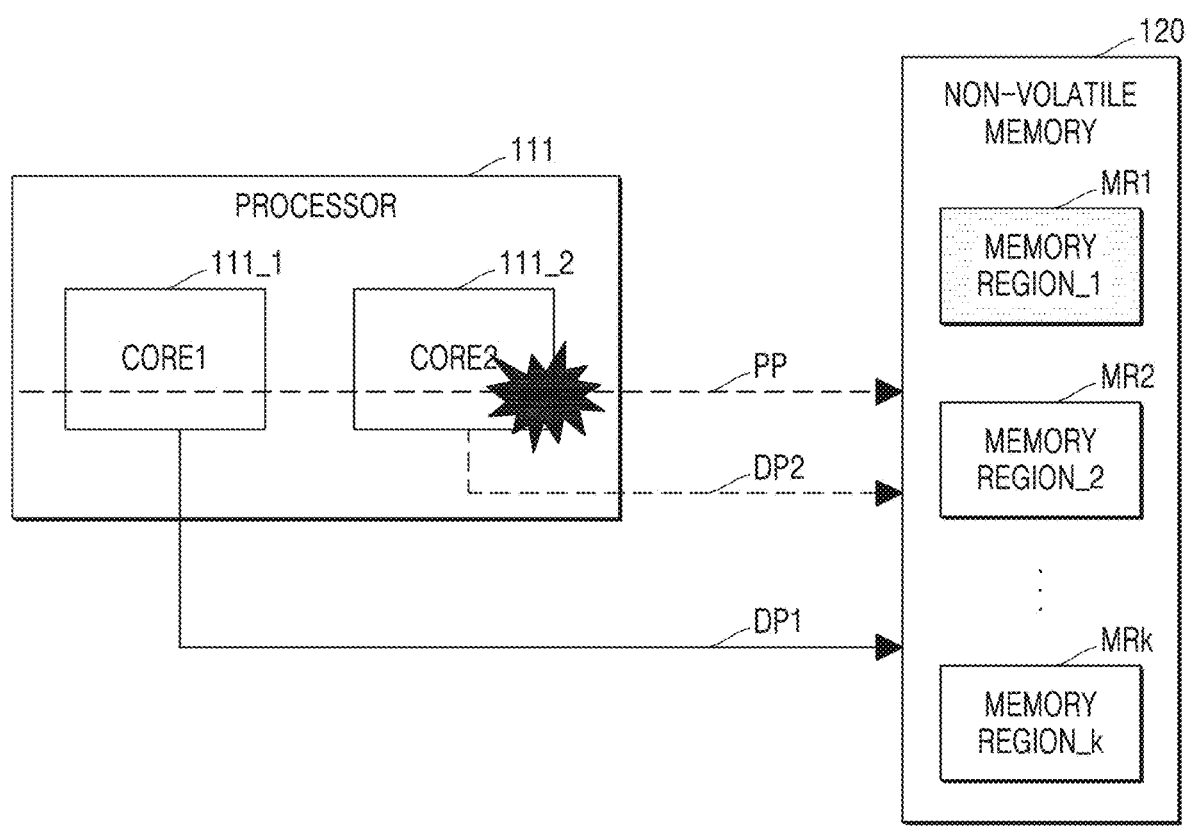
FIGS. 3 to 5 are diagrams illustrating an operation of writing data to a non-volatile memory when power supplied to a storage device is cut off according to some example embodiments of the inventive concepts.
Figure 4:
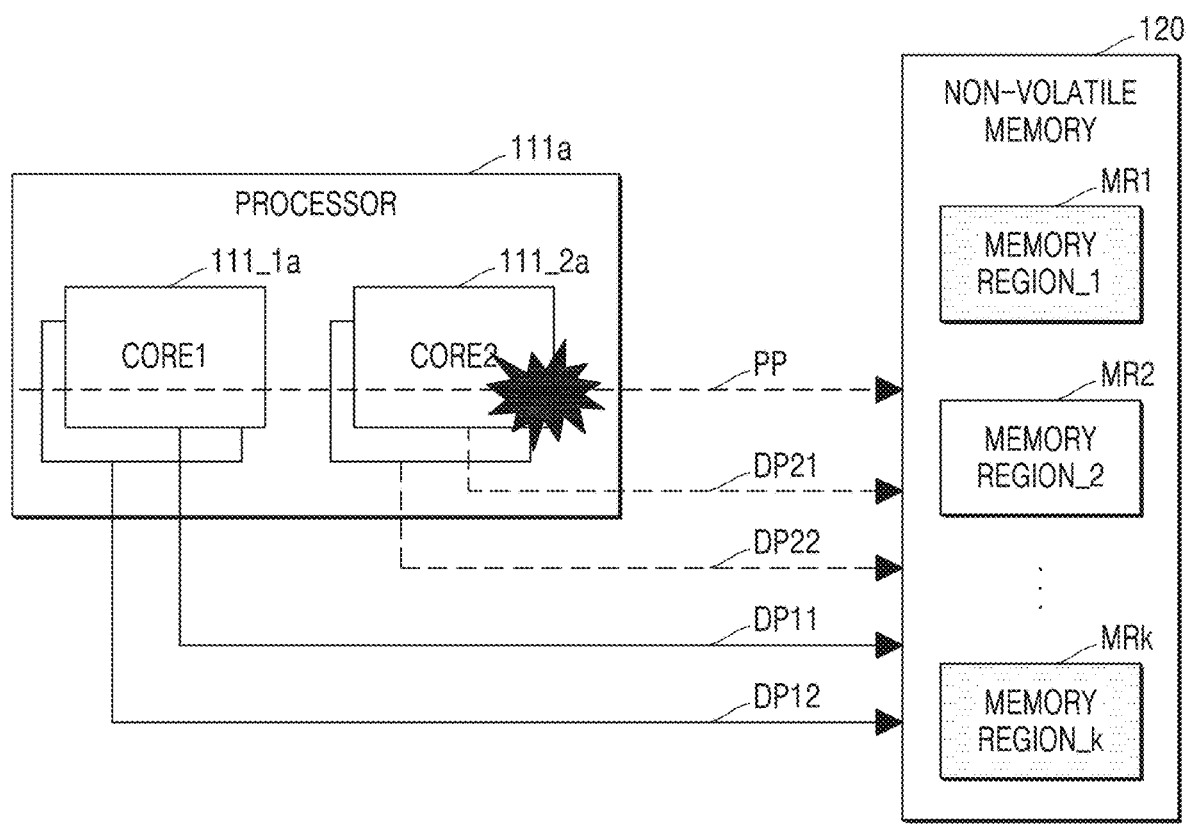
Figure 5:
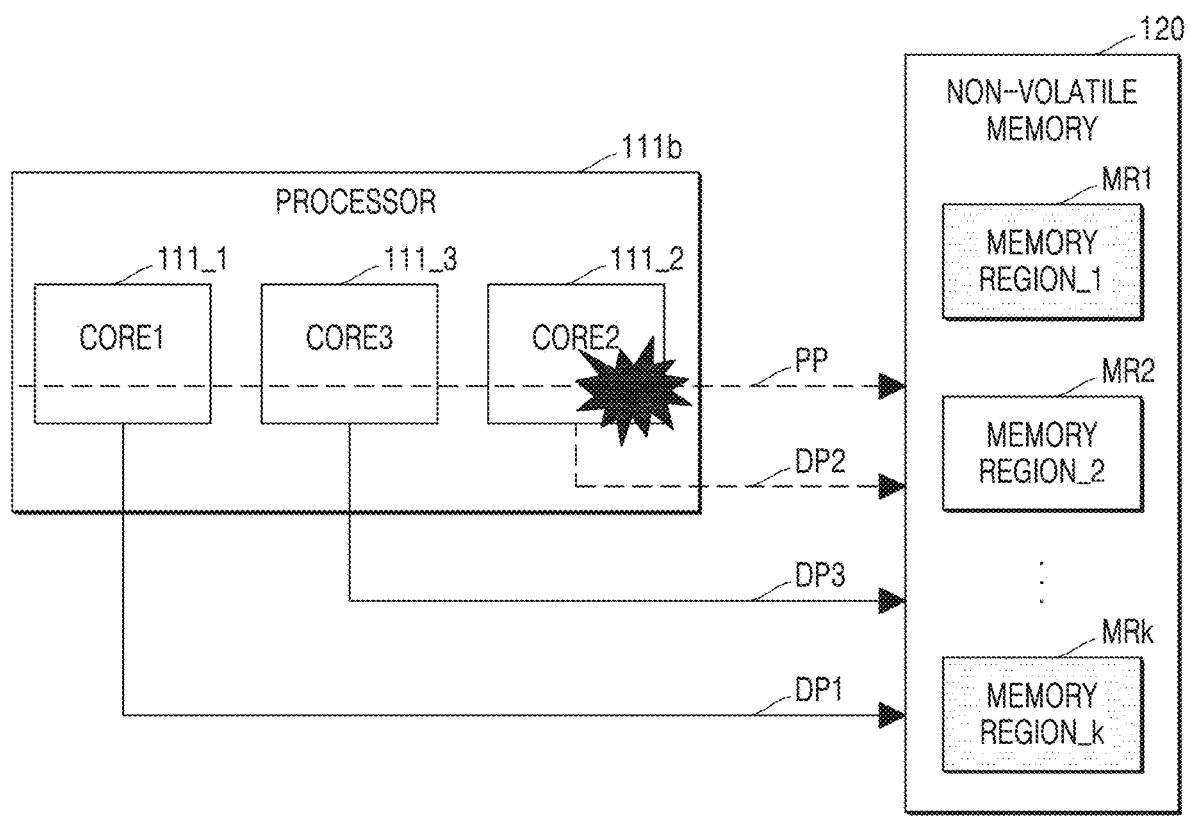

FIGS. 3 to 5 are diagrams illustrating an operation of writing data to the non-volatile memory 120 when power supplied to the storage device 100 according to some example embodiments of the inventive concepts is cut off. When power supplied to the storage device 100 is cut off, the storage device may operate using an auxiliary voltage. Processors 111, 111a, and 111b of FIGS. 3 to 5 may be the processor 111 of FIG. 2 and may include a plurality of cores.

Referring to FIG. 3, the processor 111 may include a first core 111_1 and a second core 111_2. The first core 111_1 and the second core 111_2 may be cores that process different tasks. In an example embodiment, the first core 111_1 may be a host core that performs an operation related to an interface with a host (e.g., 200 in FIG. 1), and the second core 111_2 may be an FTL core (or NAND core) that performs an operation related to an interface with the non-volatile memory 120 by driving an FTL (e.g., 112 of FIG. 2), but the inventive concepts are not limited thereto.

In the performance path PP, the first core 111_1 and the second core 111_2 may be organically connected to each other, and the first core 111_1 and the second core 111_2 may operate together with each other. Meanwhile, the first core 111_1 may write data directly to the non-volatile memory 120 through the first direct path DP1, and the second core 111_2 may write data directly to the non-volatile memory 120 through the second direct path DP2. Unlike the performance path PP, each of the first direct path DP1 and the second direct path DP2 may be configured such that only an operation of writing data to the non-volatile memory 120 may be performed and may be configured such that only a specified core operates. Accordingly, when power cutoff occurs and a fault is detected in the performance path PP, the recovery data stored in the buffer memory 113 may be stored in the non-volatile memory 120 through the first direct path DP1 or the second direct path DP2. Even if a fault occurs in the performance path PP, the storage device 100 may be prevented from (or alternatively, reduce the likelihood of) falling into an error state.

The non-volatile memory 120 may include a plurality of memory regions, for example, first to k-th memory regions MR1 to MRk. In this case, k may be a natural number of 3 or greater. The first memory region MR1, among the first to k-th memory regions MR1 to MRk, may be specified to be accessed by the first core 111_1 through the first direct path DP1, and the second memory region MR2 may be specified to be accessed by the second core 111_2 through the second direct path DP2. However, the inventive concepts are not limited thereto, and the first memory region MR1 may be specified to be accessed by the first core 111_1 through the first direct path DP1 or may be specified to be accessed by the second core 111_2 through the second direct path DP2. In an example embodiment, a memory region corresponding to a certain core may be specified in advance according to write information for writing data to the non-volatile memory 120 when a fault occurs in the performance path PP.

In FIG. 3, an example in which a fault occurs in the performance path PP and the first core 111_1 accesses the first memory region MR1 of the non-volatile memory 120 through the first direct path DP1 to write data (e.g., recovery data) is shown. However, the inventive concepts are not limited thereto, and when a fault does not occur in the second core 111_2 in the performance path PP, the second core 111_2 may write the recovery data to the second memory region MR2 through the second direct path DP2.

Referring to FIG. 4, the processor 111a may include a plurality of first cores 111_1a and a plurality of second cores 111_2a. The first cores 111_1a may be cores processing the same task, and the second cores 111_2a may be cores processing the same task. In an example embodiment, the first cores 111_1a may be host cores performing an operation related to an interface with the host 200, and the second cores 111_2a may be FTL cores (or NAND cores) performing an operation related to an interface with the non-volatile memory 120. The first direct paths DP11 and DP12 may correspond to the first cores 111_1a, respectively, and the second direct paths DP21 and DP22 may correspond to the second cores 111_2a, respectively.

A memory region for the first cores 111_1a to access through the first direct paths DP11 and DP12, respectively, may be specified, and a memory region for the second cores 111_2a to access through the second direct paths DP21 and DP22, respectively, may be specified. For example, one of the first cores 111_1a may write recovery data to the first memory region MR1 through the first direct path DP11, and the other first cores 111_1a may write recovery data to the k-th memory region MRk through the first direct path DP12.

When power is cut off and a fault is detected in the performance path PP, the first cores 111_1a may be selected as cores for performing the following operation, and the first cores 111_1a may store the recovery data, stored in the buffer memory 113, in the non-volatile memory 120 through the first direct paths DP11 and DP12 (mirroring operation). As the first cores 111_1a each write the same data to the non-volatile memory 120, even if a fault occurs in some of the first direct paths DP11 and DP12 or a fault occurs in some of the first memory region MR1 to the k-th memory region MRk, the storage device 100 may be prevented from (or alternatively, reduce the likelihood of) falling into an error state.

Referring to FIG. 5, the processor 111b may include a first core 111_1, a second core 111_2, and a third core 111_3. The first core 111_1, the second core 111_2, and the third core 111_3 may respectively be cores processing different tasks. In an example embodiment, the first core 111_1 may be a host core performing an operation related to an interface with the host 200, the second core 111_2 may be an FTL core (or NAND core) performing an operation related to an interface with the non-volatile memory 120, and the third core 111_3 may assist the operations of the first core 111_1 and the second core 111_2 between the first core 111_1 and the second core 111_2. Alternatively, the third core 111_3 may perform an operation, different from the operations of the first core 111_1 and the second core 111_2. Each of the first core 111_1, the second core 111_2, and the third core 111_3 may be configured as a single core or may be configured as a plurality of cores, as described above with reference to FIG. 4.

The performance path PP may sequentially include the first core 111_1, the third core 111_3, and the second core 111_2. The first core 111_1, the second core 111_2, and the third core 111_3 may correspond to the first direct path DP1, the second direct path DP2, and the third direct path DP3, respectively.

A memory region for the first core 111_1 to access through the first direct path DP1, for example, the first memory region MR1, may be specified. A memory region for the second core 111_2 to access through the second direct path DP2, for example, the second memory region MR2, may be specified. A memory region for the third core 111_3 to access through the third direct path DP3, for example, the k-th memory region MRk, may be specified.

When power is cut off and a fault is detected in the performance path PP, for example, the first core 111_1 and the third core 111_3 may be selected as cores for performing the following operations. The first core 111_1 and the third core 111_3 may store (perform mirroring operation) the recovery data, stored in the buffer memory 113, in the non-volatile memory 120 through the first direct path DP1 and the third direct path DP3. Because the first core 111_1 and the third core 111_3 each write the same data to the non-volatile memory 120, even if a fault occurs in some of the first direct path DP1 and the third direct path DP3, the storage device 100 may be prevented from falling into an error state.

Figure 6:
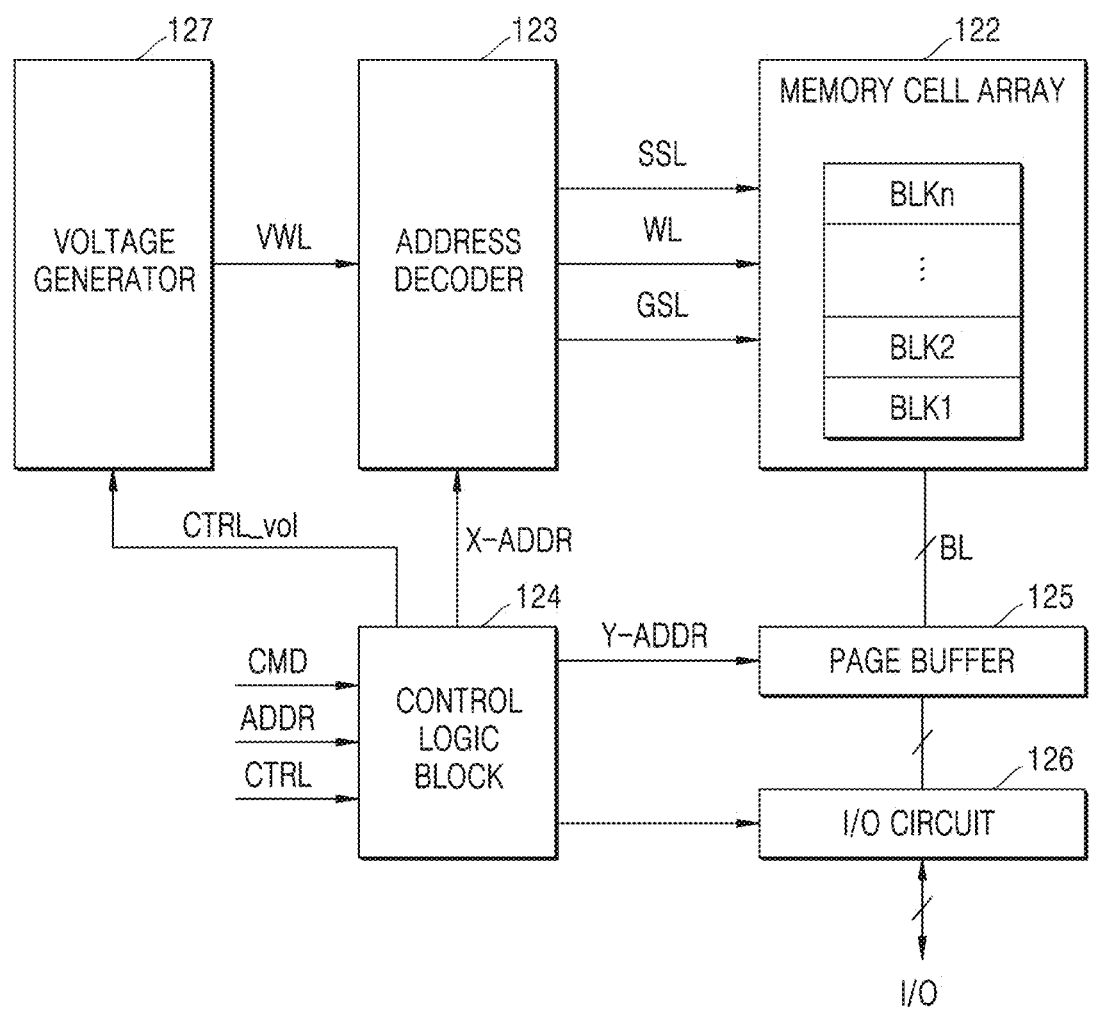
FIG. 6 is a block diagram illustrating one of a plurality of memory devices included in a non-volatile memory of FIG. 1.

FIG. 6 is a block diagram illustrating a memory device 121, among a plurality of memory devices included in the non-volatile memory 120 of FIG. 1.

Referring to FIGS. 1 and 6, the memory device 121 may include a memory cell array 122, an address decoder 123, a control logic block 124, a page buffer 125, an input/output (I/O) circuit 126, and a voltage generator 127. Although not shown, the memory device 121 may further include an I/O interface.

The memory cell array 122 may be connected to the word lines WL, the string select lines SSL, the ground select lines GSL, and the bit lines BL. The memory cell array 122 may be connected to the address decoder 123 through the word lines WL, the string selects lines SSL, and the ground select lines GSL, and may be connected to the page buffer 125 through the bit lines BL. The memory cell array 122 may include a plurality of memory blocks BLK1 to BLKn.

Each of the memory blocks BLK1 to BLKn may include a plurality of memory cells and a plurality of select transistors. The memory cells may be connected to the word lines WL, and the select transistors may be connected to the string select lines SSL or the ground select lines GSL. The memory cells of each of the memory blocks BLK1 to BLKn may include single level cells storing 1-bit data or multi-level cells storing two or more bits of data.

The address decoder 123 may select one of the memory blocks BLK1 to BLKn of the memory cell array 122, may select one of the word lines WL of the selected memory block, and may select one of the string select lines SSL.

The control logic block 124 (or the control logic circuit) may output various control signals for performing write, read, and erase operations on the memory cell array 122, based on the command CMD, the address ADDR, and the control signal CTRL. The control logic block 124 may provide a row address X-ADDR to the address decoder 123, a column address Y-ADDR to the page buffer 125, and a voltage control signal CTRL_Vol to the voltage generator 127.

Each of the memory blocks BLK1 to BLKn may include a plurality of pages. The control logic block 124 may perform an erase operation in units of each of the memory blocks BLK1 to BLKn. The control logic block 124 may perform a read operation and may perform a write operation in units of each of the pages.

The page buffer 125 may operate as a write driver or a sense amplifier according to an operation mode. During a read operation, the page buffer 125 may sense a bit line BL of the selected memory cell under the control of the control logic block 124. Sensed data may be stored in latches provided in the page buffer 125. The page buffer 125 may dump data stored in the latches to the I/O circuit 126 under the control of the control logic block 124.

The I/O circuit 126 may temporarily store the command CMD, the address ADDR, the control signal CTRL, and the data DATA provided from the outside of the memory device 121 through an I/O line I/O. The I/O circuit 126 may temporarily store read data of the memory device 121 and output the read data to the outside through the I/O line I/O at a specified time, or alternatively, at a desired time.

The voltage generator 127 may generate various types of voltages for performing a write operation, a read operation, and an erase operation on the memory cell array 122, based on the voltage control signal CTRL_Vol. In an embodiment, the voltage generator 127 may generate a word line voltage VWL, for example, a program voltage, a read voltage, a pass voltage, an erase verify voltage, or a program verify voltage. Also, the voltage generator 127 may generate a string select line voltage and a ground select line voltage based on the voltage control signal CTRL_Vol. Also, the voltage generator 127 may generate an erase voltage to be provided to the memory cell array 122.

Figure 7:
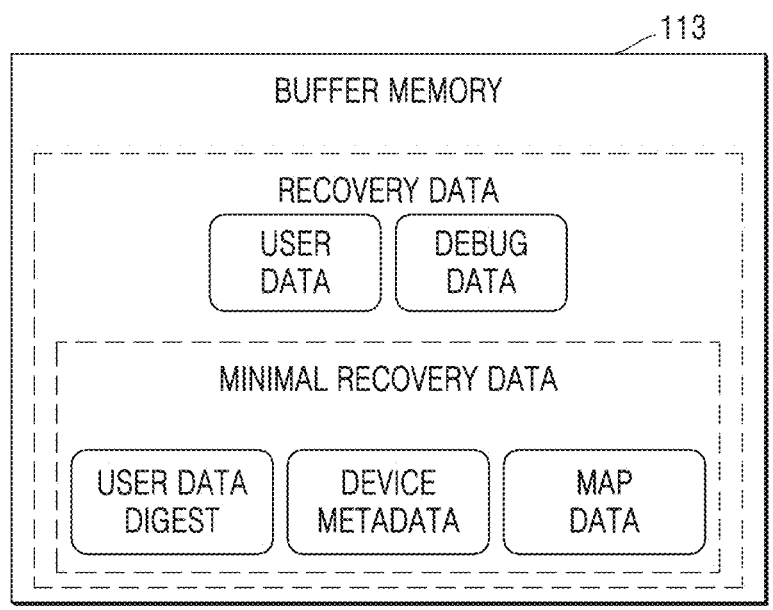
FIG. 7 is a diagram illustrating recovery data stored in a buffer memory of FIG. 2.

FIG. 7 is a diagram illustrating recovery data stored in the buffer memory 113 of FIG. 2.

Referring to FIGS. 1 and 7, recovery data may be stored in the buffer memory 113. The recovery data may be data required (or alternatively, desired) to recover the storage device 100 when power is restored after power is cut off. Accordingly, when power is cut off, the storage device 100 may move and store the recovery data stored in the buffer memory 113 to the non-volatile memory 120.

The recovery data may include user data, debug data, user data digest, device metadata, map data, and the like. The device metadata may be information on the storage device 100. For example, the device metadata may include smart data, security data, metadata on characteristics of the non-volatile memory 120, and the like. The map data is Logical-to-physical (L2P) data and may be map data for user data written in the non-volatile memory 120.

A portion of the recovery data may be primary recovery data. The primary recovery data may be data required (or alternatively, desired) to prevent (or alternatively, reduce the likelihood) the storage device 100 from entering an unusable state, that is, a power failure state. The primary recovery data may include a user data digest, device metadata, map data, and the like. In this case, the user data digest may be required (or alternatively, desired) to mark a data defect (for example, uncor mark indicating uncorrectable data) when all user data is not written to the non-volatile memory 120.

When power is cut off, the storage device 100 may move the recovery data from the buffer memory 113 to the non-volatile memory 120, and may move the primary recovery data.

Figure 8:
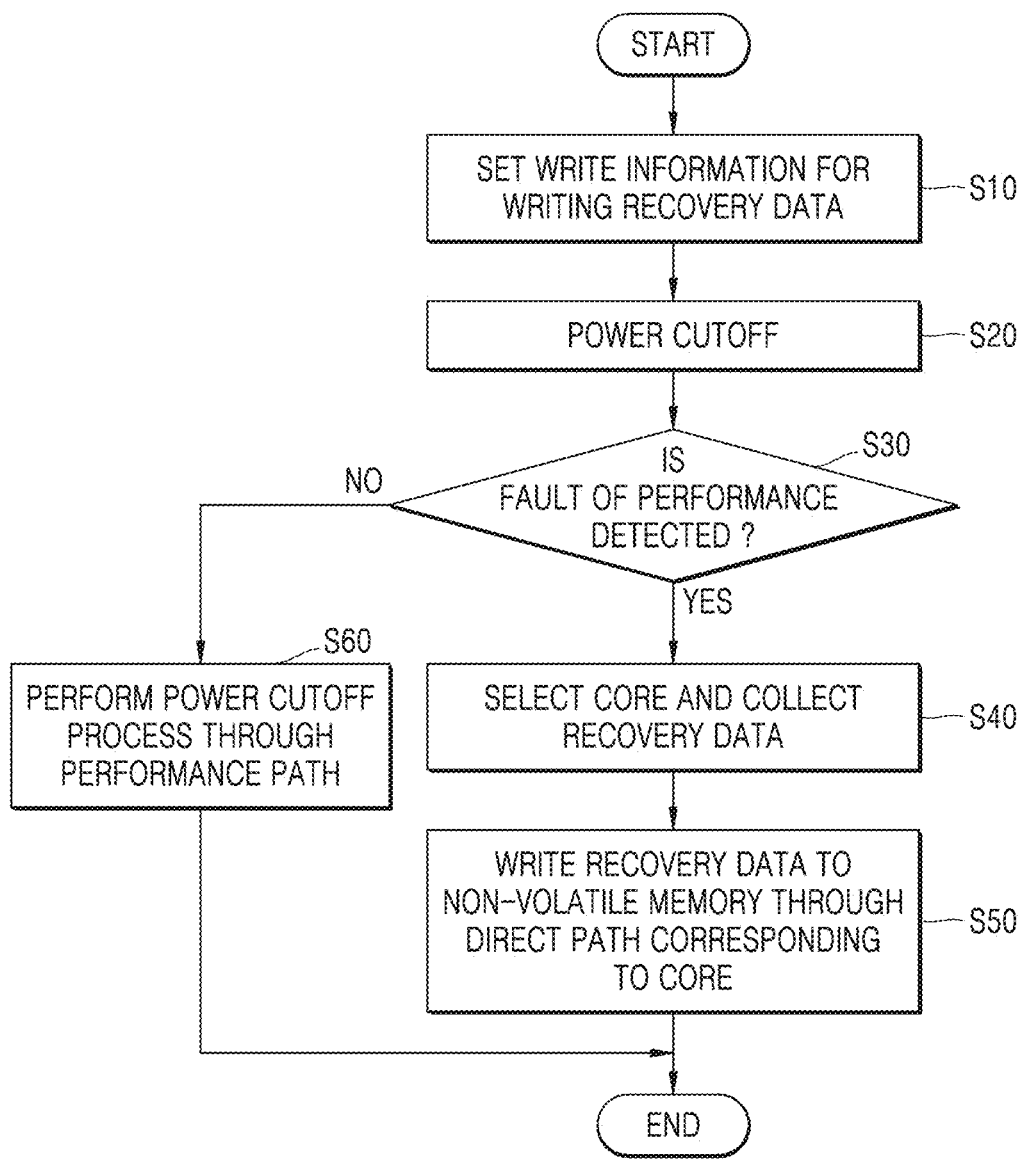
FIG. 8 is a flowchart illustrating an operating method of a storage device according to some example embodiments of the inventive concepts.

FIG. 8 is a flowchart illustrating a method of operating the storage device 100, according to some example embodiments of the inventive concepts. An operating method of operations S10 to S50 illustrated in FIG. 8 may be performed in a time series in the storage device 100 of FIG. 1.

Referring to FIGS. 1 and 8, write information for writing recovery data may be set in operation S10. In an example embodiment, operation S10 may be performed when power is provided to the storage device 100. The data write information may include information on a position and memory address of the non-volatile memory 120 to which the recovery data is to be written in operation S50 or operation S60 later.

For example, in operation S10, write information for writing data when a fault occurs in the performance path PP may be set. As described above with reference to FIGS. 3 to 5, a certain core may form a corresponding direct path, and a memory region corresponding to a certain direct path may be set in operation S10.

Power provided to the storage device 100 may be cut off in operation S20, and a fault of the performance path PP may be detected in operation S30. For example, the storage device 100 may determine whether a fault occurs in the performance path PP from an assert or a core hang. Alternatively, in an example embodiment, as is described below with reference to FIG. 8, the storage device 100 may determine that a fault occurs in the performance path PP when it is determined that each step of a power cutoff processing operation through the performance path PP is not processed within a specified time, or alternatively, a desired time.

When a fault is not detected in the performance path PP, that is, when the performance path PP is determined to be normal, the storage device 100 may perform a power cutoff process through the performance path PP in operation S60. For example, the storage device 100 may perform a power cutoff process of writing recovery data written in the buffer memory to the non-volatile memory through the performance path PP.

If a fault is detected in the performance path PP, the storage device 100 may select a core for performing subsequent operations and collect recovery data written in the buffer memory in operation S40. For example, when the processor is configured as a single core, the single core may be selected. Alternatively, for example, when the processor includes a plurality of cores, a core in which a fault does not occur may be selected from among cores in which direct paths for directly accessing the non-volatile memory 120 are formed. Also, in operation S40, the storage device 100 may reset various set values set in the non-volatile memory 120.

In operation S50, the storage device 100 may write recovery data to the non-volatile memory 120 through the direct path DP corresponding to the selected core. The storage device 100 may write the recovery data to the non-volatile memory 120, based on the write information set in operation S10.

The selected core may write recovery data to a corresponding memory region among the memory regions included in the non-volatile memory 120. The write information may include position information of the memory region corresponding to the selected core. For example, when the first core is selected as shown in FIG. 3, the storage device 100 may write recovery data to the first memory region MR1 through the first direct path DP1 in operation S50.

Accordingly, when a fault is detected in the performance path PP, the storage device 100 may store the recovery data stored in the buffer memory to the non-volatile memory 120 through the direct path DP in which the selected core directly accesses the non-volatile memory 120. Accordingly, even if an error occurs during power failure processing, the storage device may be prevented from (or alternatively, reduce the likelihood of) falling into an error state.

Figure 9:
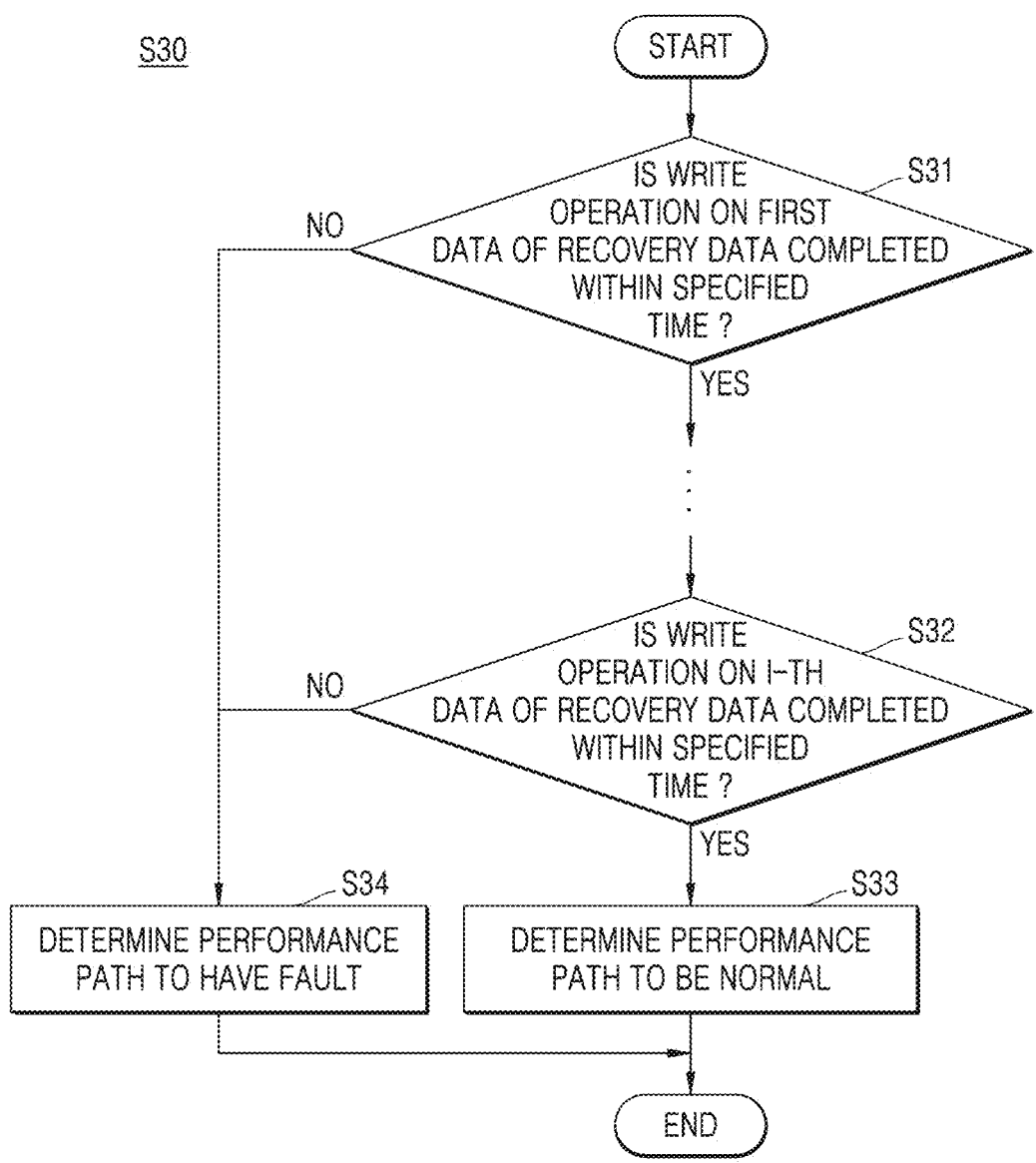
FIG. 9 is a flowchart illustrating an operating method of a storage device according to some example embodiments of the inventive concepts.

FIG. 9 is a flowchart illustrating an operating method of the storage device 100, according to some example embodiment of the inventive concepts. Operation S30 shown in FIG. 9 may be an example of operation S30 of FIG. 8 and may include operations S31 to S34.

Referring to FIGS. 1 and 9, in operation S31, the storage device 100 may determine whether a write operation on first data of the recovery data is completed within a specified time (or alternatively, a desired time), and in operation S32, the storage device 100 may determine whether a write operation on i-th data of the recovery data is completed within the specified time. That is, in operations S31 and S32, the storage device 100 may determine whether each of the write operations on the first to i-th data included in the recovery data is completed within the specified time. In this case, the write operation may refer to an operation of writing to the non-volatile memory 120, and i may be a natural number equal to or greater than 2. For example, the specified time may be 10 ms. FIG. 9 shows that operation S32 is performed after operation S31, but the inventive concepts are not limited thereto, and the execution order of operations S31 and S32 may be freely modified.

The first to i-th data may include user data, device metadata, map data, debug data, and the like. For example, the first data may be user data, the second data may be a portion of device metadata, and the third data may be another portion of the device metadata.

When all of the write operations on the first to i-th data are completed within the specified time, the storage device 100 may determine the performance path PP to be normal in operation S33. Meanwhile, if any one of the write operations on the first to i-th data is not completed within the specified time, the storage device 100 may determine that the performance path PP has a fault.

Figure 10:
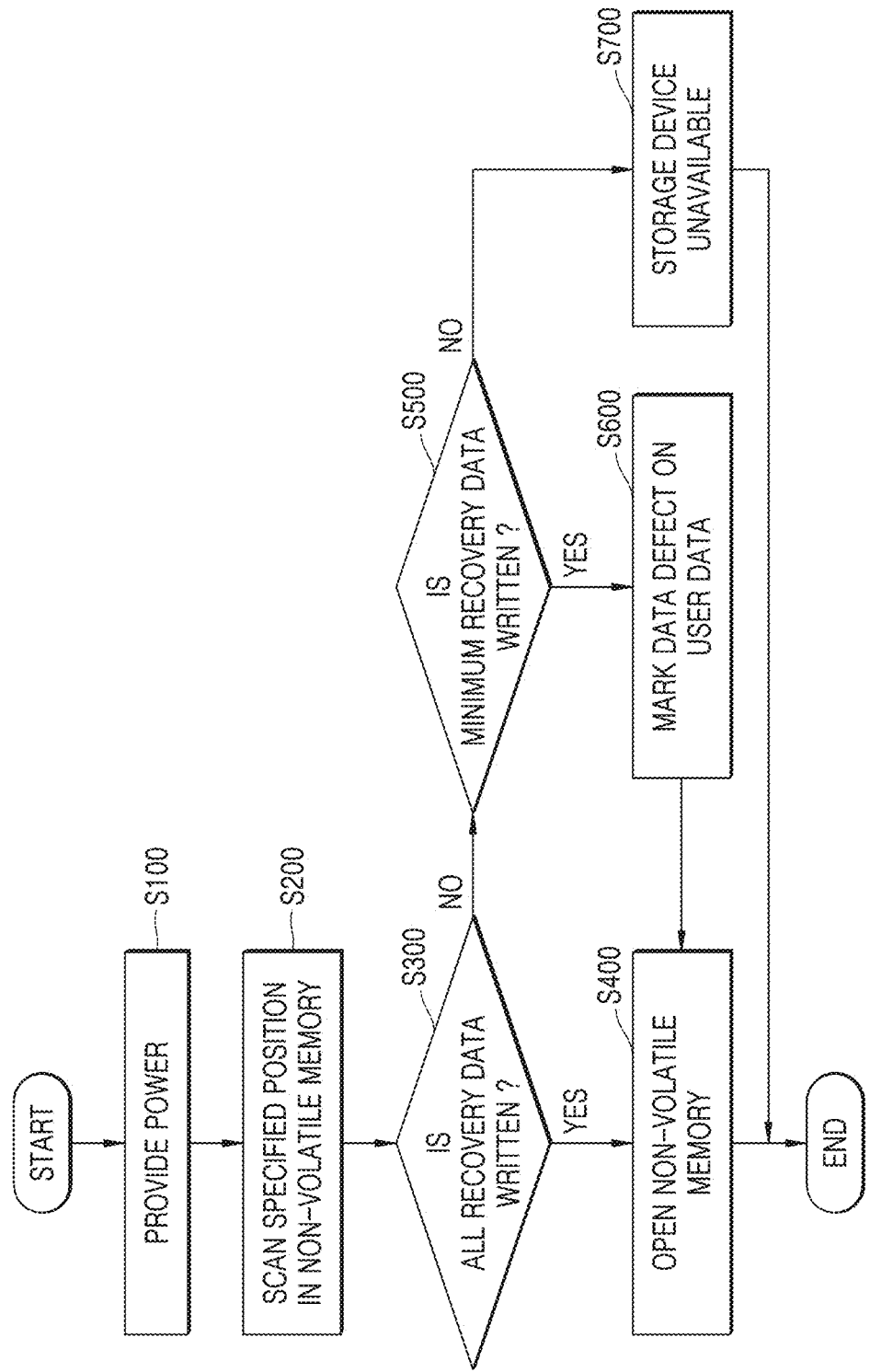
FIG. 10 is a flowchart illustrating an operating method of a storage device according to some example embodiments of the inventive concepts.

FIG. 10 is a flowchart illustrating an operating method of the storage device 100, according to some example embodiments of the inventive concepts. FIG. 10 is a diagram illustrating a recovery operation after power is supplied to the storage device 100. Operations S100 to S700 shown in FIG. 10 may be performed after operations S10 to S60 of FIG. 8 are performed.

Referring to FIGS. 1 and 10, power may be provided to the storage device 100 in operation S100, and the storage device 100 may scan a specified position in the non-volatile memory 120 in operation S200. The specified position may be a position specified in advance to store the recovery data to perform a power cutoff processing operation. For example, the storage device 100 may scan a previously specified region among the memory regions (e.g., MR1 to MRk of FIG. 3) of the non-volatile memory 120.

In operation S300, the storage device 100 may determine whether all recovery data has been written to the specified position of the non-volatile memory 120, and when all recovery data is written to the specified position, the storage device 100 may open the non-volatile memory 120 in operation S400. When the non-volatile memory 120 is opened, the storage controller 110 may control the operation of the non-volatile memory 120 through the performance path PP and may perform a write operation, a read operation, and an erase operation.

When the recovery data is not written to the specified position of the non-volatile memory 120, the storage device 100 may determine whether the primary recovery data has been written to the specified position in operation S500. The primary recovery data may include, for example, a user data digest, device metadata, and map data.

When the primary recovery data is written, the storage device 100 may mark a data defect (for example, uncor mark) on user data in operation S600. For example, the storage device 100 may mark a data defect on user data corresponding to the user data digest included in the primary recovery data.

In this case, the user data may be user data stored in the buffer memory (e.g., 113 of FIG. 7) of the storage controller 110 but not moved to the non-volatile memory 120. Accordingly, the storage device 100 may mark the corresponding user data to be defective, and transmit an error signal (e.g., the ES of FIG. 1) that is a response signal corresponding to the user data to the host 200. When operation S600 is completed, the storage device 100 may perform operation S400.

When at least a portion of the primary recovery data is not written in operation S500, the storage device 100 may determine the storage device 100 to be unavailable in operation S700. Accordingly, the storage device 100 may notify the host 200 that it is in an unavailable state.

Figure 11:
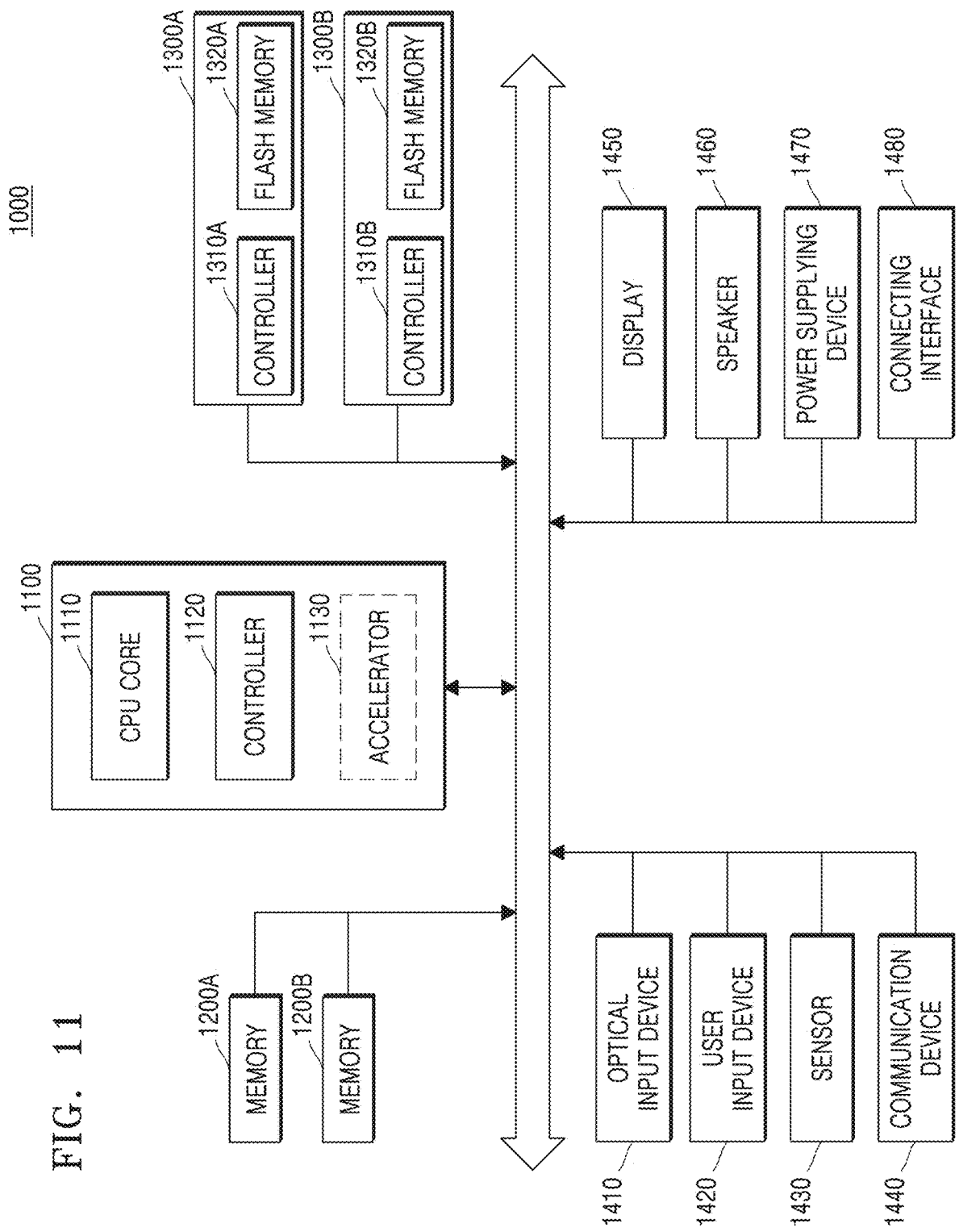
FIG. 11 is a diagram illustrating a system to which a storage device according to some example embodiments of the inventive concepts is applied.

FIG. 11 is a diagram illustrating a system 1000 to which a storage device according to some example embodiments of the inventive concepts is applied.

Referring to FIG. 11, the system 1000 of FIG. 11 may basically be a mobile system, such as a mobile phone, a smartphone, a tablet PC, a wearable device, a health care device, or an IoT device. However, the system 1000 of FIG. 11 is not necessarily limited to the mobile system and may include a PC, a laptop computer, a server, a media player, or automotive equipment, such as a navigation system.

Referring to FIG. 11, the system 1000 may include a main processor 1100, memories 1200A and 1200B, and storage devices 1300A and 1300B, and additionally include one or more of an image capturing device (or an optical input device) 1410, a user input device 1420, a sensor 1430, a communication device 1440, a display 1450, a speaker 1460, a power supplying device 1470, and a connecting interface 1480.

The main processor 1100 may control the overall operation of the system 1000, and more specifically, operations of other components constituting the system 1000. The main processor 1100 may be implemented as a general-purpose processor, a dedicated processor, or an application processor (AP).

The main processor 1100 may include one or more CPU cores 1110 and may further include a controller 1120 for controlling the memories 1200A and 1200B and/or the storage devices 1300A and 1300B. According to an embodiment, the main processor 1100 may further include an accelerator block 1130 that is a dedicated circuit for high-speed data operation, such as artificial intelligence (AI) data operation. The accelerator block 1130 may include a graphics processing unit (GPU), a neural processing unit (NPU), and/or a data processing unit (DPU), and may be implemented as a separate chip physically independent from other components of the main processor 1100.

The memories 1200A and 1200B may be used as the main memory devices of the system 1000 and may include volatile memories, such as SRAM and/or DRAM, or may include non-volatile memories, such as flash memory, PRAM and/or RRAM. The memories 1200A and 1200B may be implemented in the same package as the main processor 1100.

The storage devices 1300A and 1300B may function as non-volatile storage devices that store data regardless of whether power is supplied or not, and may have a relatively larger storage capacity than the memories 1200A and 1200B. The storage devices 1300A and 1300B may respectively include storage controllers 1310A and 1310B and non-volatile memories (NVMs) (or flash memories) 1320A and 1320B for storing data under the control of the storage controllers 1310A and 1310B. The non-volatile memories 1320A and 1320B may include NAND flash memory or may include other types of non-volatile memories, such as PRAM and/or RRAM.

The storage devices 1300A and 1300B may be included in the system 1000 by being physically separated from the main processor 1100 or may be implemented in the same package as that of the main processor 1100. In addition, because the storage devices 1300A and 1300B have the same shape as an SSD or a memory card, the storage devices 1300A and 1300B may be detachably coupled to other components of the system 1000 through an interface, such as the connecting interface 1480 to be described below. The storage devices 1300A and 1300B may be devices to which a standard protocol, such as a UFS is applied.

The storage devices 1300A and 1300B may be implemented as the storage devices 100 described above with reference to FIGS. 1 to 10. Accordingly, even if a power cutoff occurs abruptly and a fault is detected in the performance path, the storage devices 1300A and 1300B may store the recovery data stored in the buffer memory to the non-volatile memory 120 through the direct path DP, in which the core directly accesses the non-volatile memory 120. Accordingly, the storage devices 1300A and 1300B may be prevented from falling into an error state even when an error occurs due to a power failure, and the storage devices 1300A and 1300B may be continuously used.

The image capturing device 1410 may capture a still image or a moving image, and may be a camera, a camcorder, and/or a webcam.

The user input device 1420 may receive various types of data input from a user of the system 1000 and may include a touch pad, a keypad, a keyboard, a mouse, and/or a microphone.

The sensor 1430 may detect various types of physical quantities that may be acquired from the outside of the system 1000, and may convert the sensed physical quantities into electrical signals. The sensor 1430 may include a temperature sensor, a pressure sensor, an illuminance sensor, a position sensor, an acceleration sensor, a biosensor, and/or a gyroscope.

The communication device 1440 may transmit and receive signals to and from other devices outside the system 1000 according to various communication protocols. The communication device 1440 may be implemented to include an antenna, a transceiver, and/or a modem.

The display 1450 and the speaker 1460 may function as output devices that respectively output visual information and auditory information to the user of the system 1000.

The power supplying device 1470 may appropriately convert power supplied from a battery built in the system 1000 and/or an external power source and supply the converted power to each component of the system 1000.

The connecting interface 1480 may provide a connection between the system 1000 and an external device that may be connected to the system 1000 to exchange data with the system 1000. The connecting interface 1480 may be implemented in various interface methods, such as an ATA interface, a SATA interface, an external SATA (e-SATA) interface, a SCSI, a SAS interface, a PCI interface, a PCIe interface, an NVM express (NVMe) interface, an IEEE 1394 interface, a USB interface, an SD card interface, an MMC interface, an eMMC interface, a UFS, embedded UFS (eUFS) interface, a CF card interface.

Figure 12:
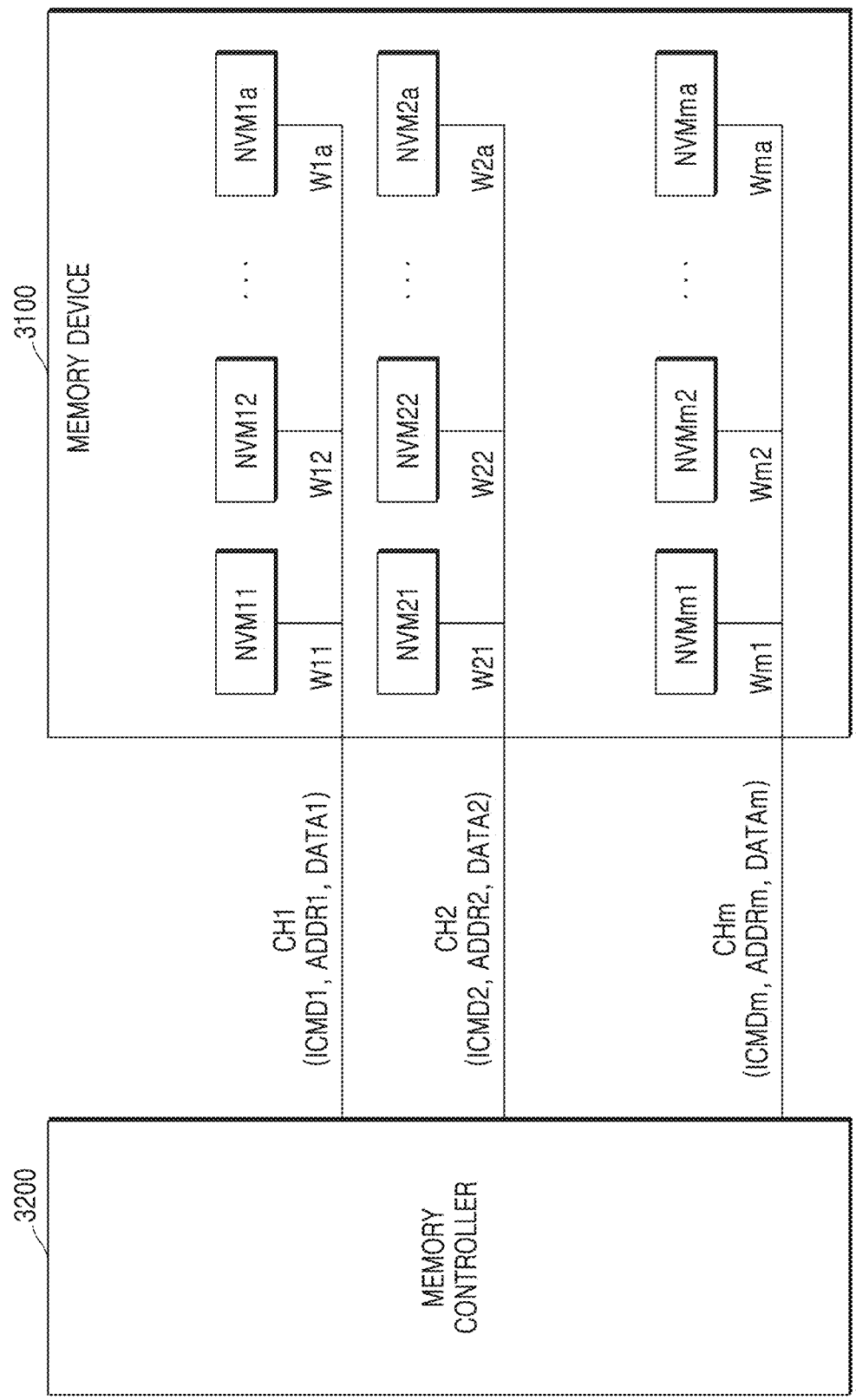
FIG. 12 is a block diagram illustrating a memory system according to some example embodiments of the inventive concepts.

FIG. 12 is a block diagram illustrating a memory system 3000 according to some example embodiment of the inventive concepts.

Referring to FIG. 12, the memory system 3000 may include a memory device 3100 and a memory controller 3200. The memory system 3000 may be the storage device 100 of FIG. 1, the memory device 3100 may be the non-volatile memory 120 of FIG. 1, and the memory controller 3200 may be the storage controller 110 of FIG. 1.

The memory system 3000 may support a plurality of channels CH1 to CHm, and the memory device 3100 and the memory controller 3200 may be connected through the channels CH1 to CHm. For example, the memory system 3000 may be implemented as a storage device, such as an SSD. The memory device 3100 may be the non-volatile memory 120 of FIG. 1, and the memory controller 3200 may be the storage controller 110 of FIG. 1.

The memory device 3100 may include a plurality of non-volatile memory devices NVM11 to NVMma. Each of the non-volatile memory devices NVM11 to NVMma may be connected to one of the channels CH1 to CHm through a corresponding way. For example, the non-volatile memory devices NVM11 to NVM1a may be connected to the first channel CH1 through ways W11 to W1a, and the non-volatile memory devices NVM21 to NVM2a may be connected to the second channel CH2 through ways W21 to W2a. In an example embodiment, each of the non-volatile memory devices NVM11 to NVMma may be implemented in a certain memory unit operating according to an individual command from the memory controller 3200. For example, each of the non-volatile memory devices NVM11 to NVMma may be implemented as a memory chip or a die, but the inventive concepts are not limited thereto.

The memory controller 3200 may transmit/receive signals to and from the memory device 3100 through the channels CH1 to CHm. For example, the memory controller 3200 may transmit commands ICMD1 to ICMDm, addresses ADDR1 to ADDRm, and data DATA1 to DATAm to the memory device 3100 or receive data DATA1 to DATAm from the memory device 3100 through the channels CH1 to CHm.

The memory controller 3200 may select one of the non-volatile memory devices connected to the corresponding channel through each channel, and transmit/receive signals to/from the selected non-volatile memory device. For example, the memory controller 3200 may select the non-volatile memory device NVM11 from among the non-volatile memory devices NVM11 to NVM1a connected to the first channel CH1. The memory controller 3200 may transmit the command ICMD1, the address ADDR1, and the data DATA1 to the selected non-volatile memory device NVM11 or receive the data DATA1 from the selected non-volatile memory device through the first channel CH1.

The memory controller 3200 may transmit/receive signals to and from the memory device 3100 in parallel through different channels. For example, the memory controller 3200 may transmit the command ICMD1 to the memory device 3100 through the second channel CH2, while transmitting the command ICMD1 to the memory device 3100 through the first channel CH1. For example, the memory controller 3200 may receive the data DATA2 from the memory device 3100 through the second channel CH2, while receiving the data DATA1 from the memory device 3100 through the first channel CH1.

The memory controller 3200 may control the overall operation of the memory device 3100. The memory controller 3200 may transmit signals to the channels CH1 to CHm to control each of the non-volatile memory devices NVM11 to NVMma connected to the channels CH1 to CHm. For example, the memory controller 3200 may transmit the command ICMD1 and the address ADDR1 to the first channel CH1 to control a selected one of the non-volatile memory devices NVM11 to NVM1a.

Each of the non-volatile memory devices NVM11 to NVMma may operate under the control of the memory controller 3200. For example, the non-volatile memory device NVM11 may write the data DATA1 according to the command ICMD1, the address ADDR1, and the data DATA1 provided to the first channel CH1. For example, the non-volatile memory device NVM21 may read the data DATA2 according to the command ICMD2 and the address ADDR2 provided to the second channel CH2, and transfer the read data DATA2 to the memory controller 3200.

In FIG. 12, the memory device 3100 communicates with the memory controller 3200 through m channels and the memory device 3100 includes a number of non-volatile memory devices corresponding to each channel, but the number of channels and the number of non-volatile memory devices connected to one channel may be variously changed.

While the inventive concepts have been particularly shown and described with reference to example embodiments thereof, it will be understood that various changes in form and details may be made therein without departing from the spirit and scope of the following claims.

What is claimed is:

1. A storage device comprising: a non-volatile memory including a plurality of memory regions; and a storage controller including a plurality of cores and a buffer memory configured to store recovery data, the storage controller configured to communicate with the non-volatile memory through both a performance path that includes the plurality of cores and at least one direct path of a plurality of direct paths each corresponding to one of the plurality of cores in which at least one of the plurality of cores is directly connected to the non-volatile memory without traversing other direct paths of ones of the plurality of cores, the storage controller configured to communicate with the non-volatile memory by, communicating with the non-volatile memory via the performance path during normal operation, in which the plurality of cores operate together to perform a write operation, a read operation or an erase operation, detecting whether a fault is present in performance of the performance path, in response to a power being cut-off to the storage device, and in response to the fault being detected as present in the performance path while the power remains cut-off, moving the recovery data from the buffer memory to the non-volatile memory by transmitting the recovery data to the non-volatile memory through the at least one direct path, wherein the performance path is for performing the write operation, the read operation, and the erase operation, and wherein the at least one direct path is for performing only the write operation.

2. The storage device of claim 1, wherein the plurality of cores includes a first core configured to perform an operation related to an interface with a host, and a second core configured to perform an operation related to an interface with the non-volatile memory, the first core and the second core being included in the performance path, and in response to the fault being detected as present in the performance path while the power remains cut-off, the storage controller is configured to select one of the plurality of cores as a selected core and move the recovery data from the buffer memory to the non-volatile memory by transmitting the recovery data to the non-volatile memory via a corresponding one of the plurality of direct paths.

3. The storage device of claim 2, wherein
the at least one direct path includes a first direct path and a second direct path,
the first core is configured to write the recovery data to a first memory region, among the plurality of memory regions, through the first direct path, and
the second core is configured to write the recovery data to a second memory region, among the plurality of memory regions, through the second direct path.

4. The storage device of claim 1, wherein the storage controller includes:
a plurality of first cores configured to perform an operation related to an interface with a host; and
a plurality of second cores configured to perform an operation related to an interface with the non-volatile memory,
the performance path includes the plurality of first cores and the plurality of second cores, and
in response to the power being cut off and the fault being detected in the performance path, each of the first cores is configured to write the recovery data to the non-volatile memory through the at least one direct path.

5. The storage device of claim 1, wherein
the storage controller includes first to third cores sequentially included in the performance path, and
in response to the power being cut off and the fault being detected in the performance path, each of the first and second cores is configured to write the recovery data to the non-volatile memory through the at least one direct path.

6. The storage device of claim 5, wherein the at least one direct path includes a first direct path, a second direct path and a third direct path,
the first core is configured to write the recovery data to a first memory region, among the plurality of memory regions, through the first direct path, and
the third core is configured to write the recovery data in a second memory region, among the plurality of memory regions, through the third direct path.

7. The storage device of claim 1, wherein the recovery data includes user data, debug data, user data digest, device metadata, and map data.

8. An operating method of a storage device including a storage controller and a non-volatile memory, the storage controller including a plurality of cores and a buffer memory configured to store recovery data, the operating method comprising: communicating with the non-volatile memory through both a performance path that includes the plurality of cores and at least one direct path of a plurality of direct paths each corresponding to one of the plurality of cores in which at least one of the plurality of cores is directly connected to the non-volatile memory without traversing other direct paths of ones of the plurality of cores, the communicating including, communicating with the non-volatile memory via the performance path during normal operation, in which the plurality of cores operate together to perform a write operation, a read operation or an erase operation, detecting whether a fault is present in performance of the performance path, in response to a power being cut-off to the storage device, in response to the fault being detected as present in the performance path while the power remains cut-off, selecting one of the plurality of cores as a selected core and collecting recovery data written in the buffer memory, and moving the recovery data from the buffer memory to the non-volatile memory by transmitting the recovery data to the non-volatile memory through the direct path corresponding to the selected core, wherein the performance path is for performing the write operation, the read operation, and the erase operation, and wherein the direct path is for performing only the write operation.

9. The operating method of claim 8, further comprising:
writing the recovery data to the non-volatile memory through the performance path, in response to the power being cut off and the performance path being determined to be normal.

10. The operating method of claim 8, wherein the recovery data includes user data, debug data, user data digest, device metadata, and map data.

11. The operating method of claim 8, further comprising:
determining the performance path to be normal, in response to each of write operations of writing first to n-th data of the recovery data to the non-volatile memory being completed within a first time.

12. The operating method of claim 8, further comprising:
setting write information including position information indicating a position in the non-volatile memory to which the recovery data is to be written,
wherein the writing of the recovery data includes writing the recovery data to the non-volatile memory based on the write information.

13. The operating method of claim 12, wherein
the non-volatile memory includes a plurality of memory regions, and
the writing of the recovery data includes writing the recovery data to a memory region among the plurality of memory regions corresponding to the selected core based on the write information.

14. The operating method of claim 8, further comprising:
scanning a specified position in the non-volatile memory in response to the power being provided; and
opening the non-volatile memory in response to the recovery data being all written to the specified position.

15. The operating method of claim 8, further comprising:
scanning a specified position in the non-volatile memory in response to the power being provided; and
in response to primary recovery data, among the recovery data, being written to the specified position, marking a data defect on user data corresponding to the primary recovery data.

16. The operating method of claim 15, wherein the primary recovery data includes a user data digest, device metadata, and map data.

17. The operating method of claim 15, further comprising:
in response to the primary recovery data, among the recovery data, being written to the specified position, transmitting, to a host, an error signal as a response signal according to the user data corresponding to the primary recovery data.

18. An operating method of a storage device including a storage controller and a non-volatile memory, the storage controller including a plurality of cores and a buffer memory configured to store recovery data, the operating method comprising: setting write information for writing recovery data written in a buffer memory to the non-volatile memory; and communicating with the non-volatile memory through both a performance path that includes the plurality of cores and at least one direct path of a plurality of direct paths each corresponding to one of the plurality of cores in which at least one of the plurality of cores is directly connected to the non-volatile memory without traversing other direct paths of ones of the plurality of cores, the communicating including, communicating with the non-volatile memory via the performance path during normal operation, in which the plurality of cores operate together to perform a write operation, a read operation or an erase operation on the data, detecting whether a fault is present in performance of the performance path, in response to a power being cut-off to the storage device, and in response to the fault being detected as present in the performance path while the power remains cut-off, selecting, based on the write information, one of the plurality of cores as a selected core and collecting the recovery data, and moving the recovery data from the buffer memory to the non-volatile memory by transmitting the recovery data to the non-volatile memory through the direct path corresponding to the selected core, wherein the performance path includes the plurality of cores, and the direct path includes one of the plurality of cores.

19. The operating method of claim 18, further comprising:
scanning a specified position in the non-volatile memory in response to the power being provided; and
opening the non-volatile memory in response to the recovery data being all written to the specified position.

20. The operating method of claim 19, further comprising:
marking a data defect on user data corresponding to primary recovery data among the recovery data, in response to the primary recovery data being written to a specified position, and
wherein the primary recovery data includes a user data digest, device metadata, and map data.

* * * * *